United States Patent
Lee et al.

(10) Patent No.: US 9,331,161 B1
(45) Date of Patent: May 3, 2016

(54) METAL GATE STRUCTURE AND METHOD OF FORMING THE SAME

(71) Applicant: UNITED MICROELECTRONICS CORP., Hsin-Chu (TW)

(72) Inventors: Chi-Ju Lee, Tainan (TW); Yao-Chang Wang, Tainan (TW); Nien-Ting Ho, Tainan (TW); Chi-Mao Hsu, Tainan (TW); Kuan-Cheng Su, Taipei (TW); Main-Gwo Chen, Hsin-Chu (TW); Hsiao-Kwang Yang, Hsinchu County (TW); Fang-Hong Yao, New Taipei (TW); Sheng-Huei Dai, Taitung County (TW); Tzung-Lin Li, Hsinchu (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/554,068

(22) Filed: Nov. 26, 2014

(30) Foreign Application Priority Data

Oct. 30, 2014 (CN) .......................... 2014 1 0596532

(51) Int. Cl.
*H01L 21/02* (2006.01)
*H01L 29/423* (2006.01)
*H01L 29/49* (2006.01)
*H01L 29/51* (2006.01)
*H01L 21/28* (2006.01)

(52) U.S. Cl.
CPC .... *H01L 29/42376* (2013.01); *H01L 21/02178* (2013.01); *H01L 21/02186* (2013.01); *H01L 21/02194* (2013.01); *H01L 21/02244* (2013.01); *H01L 21/28079* (2013.01); *H01L 21/28088* (2013.01); *H01L 29/4958* (2013.01); *H01L 29/4966* (2013.01); *H01L 29/517* (2013.01)

(58) Field of Classification Search
CPC ................................................. H01L 29/42376
USPC ......................................................... 257/295
See application file for complete search history.

(56) References Cited

U.S. PATENT DOCUMENTS 8,294,202 B2 10/2012 Jangjian
2012/0292721 A1 11/2012 Huang
2014/0110790 A1 4/2014 Huang

OTHER PUBLICATIONS

Tsai, Title of Invention: Semiconductor Structure and Process Thereof, U.S. Appl. No. 13/495,009, filed Jun. 13, 2012.

*Primary Examiner* — Anthony Ho
(74) *Attorney, Agent, or Firm* — Winston Hsu; Scott Margo

(57) ABSTRACT

The present invention provides a metal gate structure which is formed in a trench of a dielectric layer. The metal gate structure includes a work function metal layer and a metal layer. The work function metal layer is disposed in the trench and comprises a bottom portion and a side portion, wherein a ratio between a thickness of the bottom portion and a thickness of the side portion is between 2 and 5. The trench is filled with the metal layer. The present invention further provides a method of forming the metal gate structure.

9 Claims, 5 Drawing Sheets

METAL GATE STRUCTURE AND METHOD OF FORMING THE SAME

BACKGROUND OF THE INVENTION

1. Field of the Invention

The present invention is related to a metal gate structure and a method of forming the same, and more particularly, to a metal gate structure having work function metal (WFM) layer with stable crystal phase and a method of forming the same.

2. Description of the Prior Art

Poly-silicon is conventionally used as a gate electrode in semiconductor devices, such as metal-oxide-semiconductors (MOS). However, with a trend toward scaling down the size of semiconductor devices, the conventional poly-silicon gate faces problems like low performances due to boron penetration, and unavoidable depletion effect that increases the equivalent thickness of the gate dielectric layer, reduces the gate capacitance, and worsens a driving force of the devices. Therefore, work function metals are used to replace the conventional poly-silicon gates as control electrodes that are suitable as high-K gate dielectric layers.

In a complementary metal-oxide semiconductor (CMOS) device, one of the dual work function metal gates is used in an NMOS device and the other one is alternatively used in a PMOS device. It is well-known that the compatibility and the process controls of the dual metal gates are more complicated, whereas the thickness and the composition controls of the materials used in the dual metal gate method are more precise. The conventional dual metal gate methods are categorized into gate first processes and gate last processes. In a conventional dual metal gate method applied with the gate first process, the annealing process for forming the source/drain ultra-shallow junction and the silicide process are performed after forming the metal gate. In the conventional gate last process, a sacrificial gate or a replacement gate is provided in a first step, followed by performing processes used to construct a normal MOS transistor. Then, the sacrificial/replacement gate is removed to form a gate trench. Consequently, the gate trench is filled with metals according to the different electrical requirements. However, because of the complicated steps of the gate last processes, the manufacturers are devoted to simplifying the manufacturing process.

In the gate first process or the gate last process, the metal gate of the PMOS or the NMOS may include a plurality of metal layers. The materials of the metal layers always affect the work function of the NMOS or the PMOS, and consequently affect the performances of the product. Thus, the manufacturers are searching for new manufacturing method to obtain a MOS with better work function performances.

SUMMARY OF THE INVENTION

The present invention therefore provides a metal gate structure and a method of forming the same, thereby obtaining a metal gate with good electrical performance.

According to one embodiment of the present invention, a metal gate structure is provided. The metal gate structure is formed in a trench of a dielectric layer. The metal gate structure includes a work function metal layer and a metal layer. The work function metal layer is disposed in the trench and comprises a bottom portion and a side portion, wherein a ratio between a thickness of the bottom portion and a thickness of the side portion is between 2 and 5. The trench is filled with the metal layer.

According to another embodiment of the present invention, a method of forming a metal gate structure is provided. First, a dielectric layer with a trench is provided. A work function metal (WFM) layer in the trench is formed under a temperature greater than 200 Celsius degrees. Next, an oxidation process is performed for the WFM layer, thereby forming a metal oxide layer, and a metal layer is formed on the metal oxide layer, thereby filling the trench.

The metal gate structure and the method set forth in the present invention has a WFM layer with stable crystal phase and a thicker bottom portion, thus solving many problems in convention arts.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the presented invention, preferred embodiments will be made in detail. The preferred embodiments of the present invention are illustrated in the accompanying drawings with numbered elements.

Please refer to FIG. 1 to FIG. 8. FIG. 1 to FIG. 8 are schematic diagrams of the method of forming an metal gate structure according to one embodiment of the present invention. First, a substrate 600 is provided, such as a silicon substrate, a silicon-containing substrate, an epitaxial silicon substrate, a silicon germanium substrate, a silicon carbide substrate or a silicon-on-insulator (SOI) substrate, and is not limited thereto. A plurality of shallow trench isolations (STI) 602 are disposed on the substrate 600. A transistor 604 is formed on the substrate 600 surrounded by the STI 602. The transistor 604 can be a PMOS or an NMOS. The following descriptions will show the transistor 604 being an NMOS as one embodiment.

Figure 1:
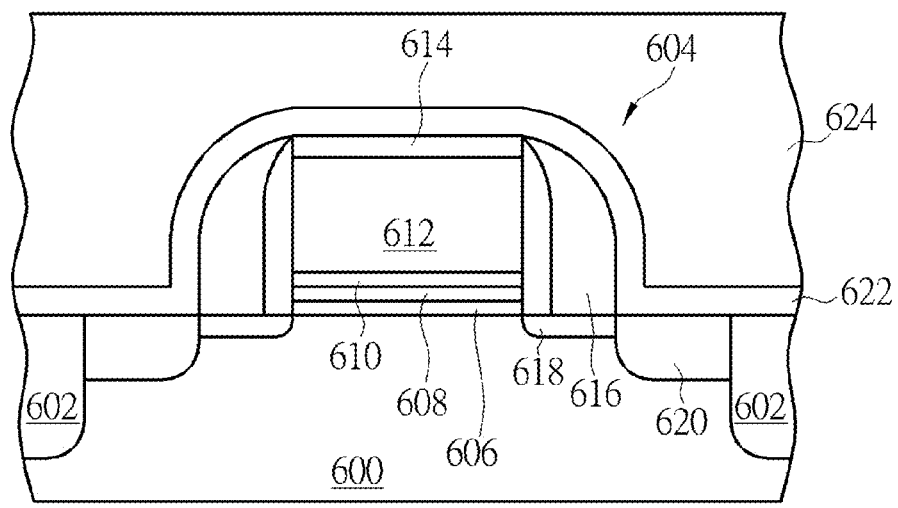
FIG. 1 to FIG. 8 show schematic diagrams of a method of forming a metal gate structure according one embodiment of the present invention.

In one embodiment shown in FIG. 1, the transistor 604 includes an interface layer 606, a high-k dielectric layer 608, an etch stop layer 610, a sacrificial gate 612, a cap layer 614, a spacer 616, a lightly doped drain (LDD) 618 and a source/drain region 620. In one preferred embodiment of the present invention, the interface layer 606 can be a $SiO_2$ layer. The high-k dielectric layer 608 has a dielectric constant greater than 4, and the material thereof includes rare earth metal oxides or lanthanide oxides, such as hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), lanthanum aluminum oxide (LaAlO), tantalum oxide ($Ta_2O_5$), zirconium oxide ($ZrO_2$), zirconium silicon oxide ($ZrSiO_4$), hafnium zirconium oxide (HfZrO), yttrium oxide ($Yb_2O_3$), yttrium silicon oxide (YbSiO), zirconium aluminate (ZrAlO), hafniumaluminate (HfAlO), aluminum nitride (AlN), titanium oxide ($TiO_2$), zirconium oxynitride (ZrON), hafnium oxynitride (HfON), zirconium silicon oxynitride (ZrSiON), hafnium silicon oxynitride (HfSiON), strontium bismuth tantalite ($SrBi_2Ta_2O_9$, SBT), lead zirconate titanate (PbZr$_x$Ti$_{1-x}$O$_3$, PZT) or barium strontium titanate (Ba$_x$Sr$_{1-x}$TiO$_3$, BST), but is not limited thereto. The etch stop layer 610 includes metal or metal/metal nitride, such as TiN. The sacrificial gate 612 is a poly-silicon gate. In another embodiment, the sacrificial gate 612 is a multi-layered gate including a poly-silicon layer, an amorphous silicon layer or a germanium layer. The cap layer 614 is a SiN layer for example. The spacer 616 can be a multi-layered structure including high temperature oxide (HTO), SiN, SiO or SiN formed by hexachlorodisilane (Si$_2$Cl$_6$) (HCD-SiN). The LDD 618 and the source/drain region 620 are formed by appropriate dopants implantation. In one embodiment, the interface layer 606 and the etch stop layer 610 can be omitted.

Next, a contact etch stop layer (CESL) 622 and an interlayer dielectric (ILD) layer 624 are formed on the substrate 600 to cover the transistor 604. In one embodiment, the CESL 622 can generate stress to form a selective strain scheme (SSS) for the transistor 604. In one embodiment, the CESL 622 can be omitted.

Figure 2:
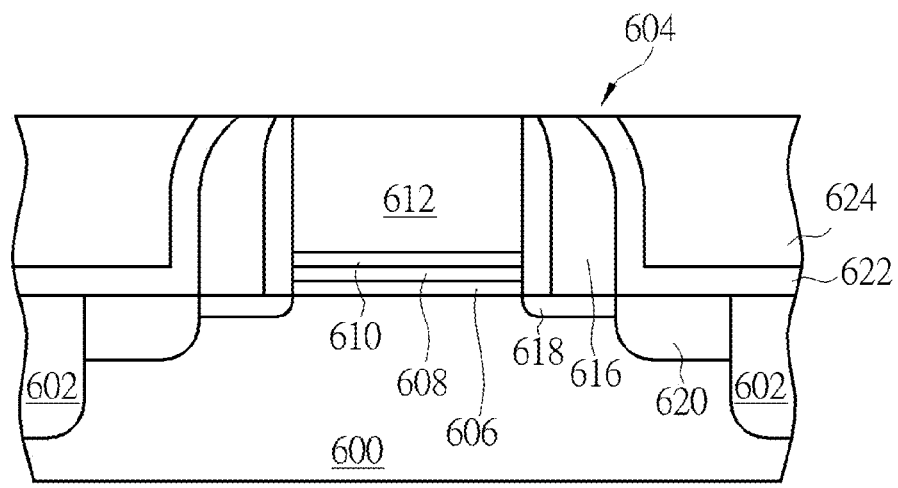

As shown in FIG. 2, a planarization process, such as a chemical mechanical polish (CMP) process or an etching-back process or combination thereof is performed to remove a part of the ILD layer 624, a part of the CESL 622, a part of the spacer 616, and completely remove the cap layer 614, until a top surface of the sacrificial gate 612 is exposed.

Figure 3:
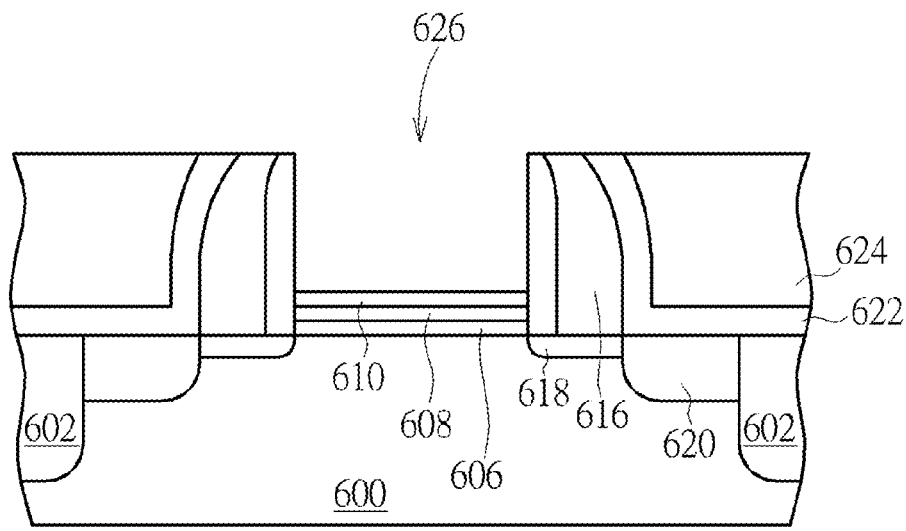

As shown in FIG. 3, a wet etching process and/or a dry etching process is performed to remove the sacrificial gate 612 until exposing the etch stop layer 610. A trench 626 is therefore formed in the transistor 626. In one embodiment, after forming the trench 626, the etch stop layer 610 can be removed.

Figure 4:
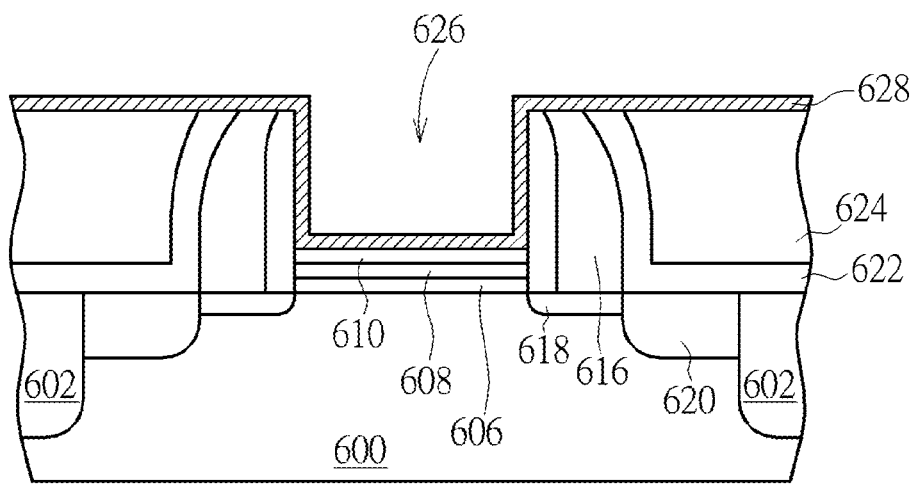

As shown in FIG. 4, a bottom barrier layer 628 is formed comprehensively on the substrate 600 and along a surface of the trench 626. The trench 626 is not completely filled with the bottom barrier layer 628. The bottom barrier layer 628 comprises TiN, Ti/TiN, TaN, Ta/TaN, but is not limited thereof. In one embodiment, the bottom barrier layer 628 can comprise multi layers, for example, comprise a first barrier layer (not shown), and a second barrier layer (not shown) disposed thereabove, wherein the first barrier layer is TiN and the second barrier layer is TaN.

Figure 5:
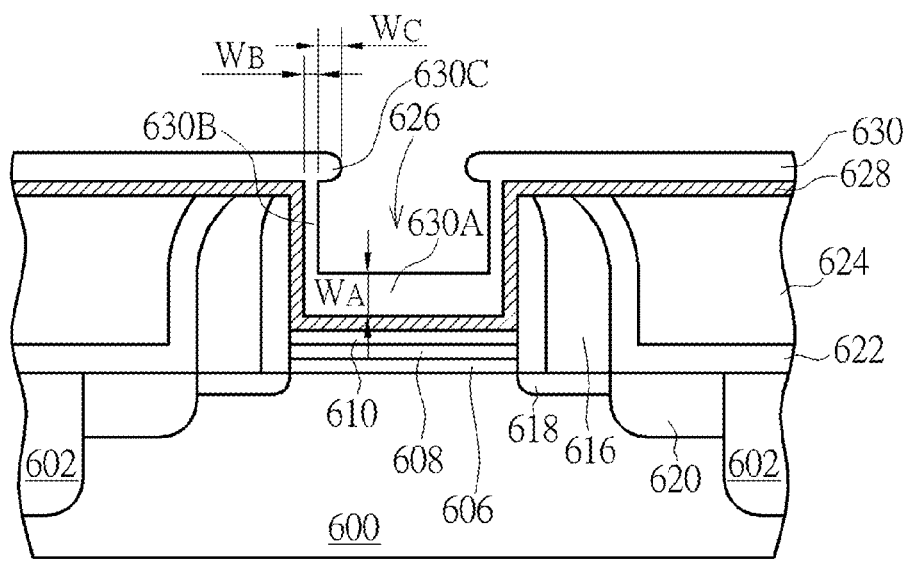

As shown in FIG. 5, a work function metal (WFM) layer 630 is formed conformally on the bottom barrier layer 628 wherein the trench 626 is not completely filled with the WFM layer 630. The WFM layer 630 serves as a work function metal required by a transistor 604. When the transistor 604 is PMOS, the WFM layer 630 includes Ni, Pd, Pt, Be, Ir, Te, Re, Ru, Rh, W, Mo, or WN, RuN, MoN, TiN, TaN, or WC, TaC, TiC, or TiAlN, TaAlN, and is not limited thereto. When the transistor 604 is NMOS, the WFM layer 630 includes titanium aluminides (TiAl), aluminum zirconium (ZrAl), aluminum tungsten (WAl), aluminum tantalum (TaAl) or aluminum hafnium (HfAl), but should not be limited thereto. In one embodiment, the step of forming the WFM layer 630 includes a high temperature deposition process. For example, said high temperature deposition process is performed under a temperature greater than 200 Celsius degrees, such as 200 Celsius degrees to 400 Celsius degrees, and preferably is carried out in vacuum (≈0 atm). In comparison with conventional WFM layer which is formed under room temperature, the WFM layer 630 formed by the method in the present invention can have a relatively stable crystal phase.

Figure 9:
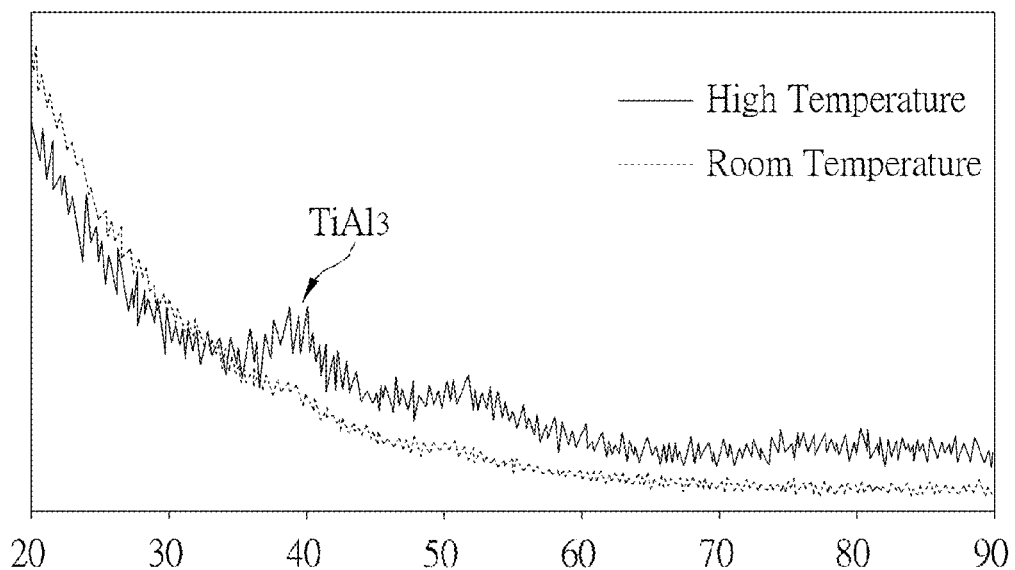
FIG. 9 shows an X-ray diffusion picture of the WFM layer with stable crystal phase in the present invention.

Please refer to FIG. 9, which shows an X-ray diffusion picture of the WFM layer with stable phase provided by the present invention, wherein the x-coordinate represents the angle and the y-coordinate represents the intensity. FIG. 9 shows one embodiment when the WFM layer 630 is TiAl. As shown, the WFM layer formed under high temperature in the present invention (represented by solid line) forms a stable crystal phase, TiAl$_3$. In contrast, the conventional WFM layer formed under room temperature (represented by dash line) lakes such stable crystal phase. In one embodiment, such WFM layer 630 with stable crystal phase can be represent as TiAl$_x$, wherein x is 3. In another embodiment, depending on the material of the metal layer (not shown in FIG. 5) formed in the subsequent steps, the WFM layer 630 can be TiAl$_x$Cu$_y$, and x+y=3.

Figure 10:
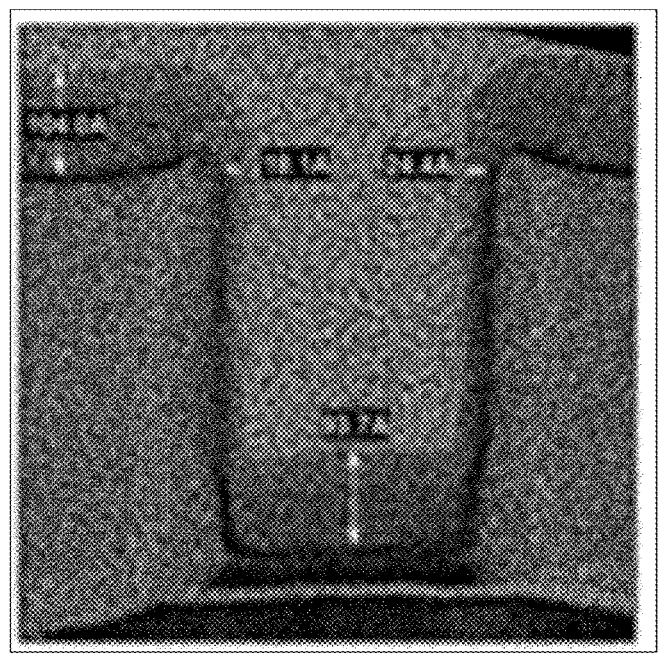
FIG. 10 shows a microscope picture of the WFM layer in the present invention.

In addition, please refer to FIG. 10, which shows a microscope picture of the WFM layer in the present invention. As shown in FIG. 10, it is one salient feature in the present invention that the formed WFM layer 630 has a thicker bottom portion, a thinner side portion, and a smaller overhang portion. Please again see FIG. 5, the WFM layer 630 in the trench 626 has a bottom portion 630A, a side portion 630B and a protruding portion 630C. The bottom portion 630A is located at bottom of the trench 626 and has a bottom thickness W$_A$; the side portion 630B is adjacent to the sidewall of the trench 626 and has a side thickness W$_B$; the protruding portion 630C is located at the opening of the trench 626, protruding from the side portion 630B to central axis of the trench 626, wherein the protruding portion 630C has a protruding thickness W$_C$. The bottom thickness W$_A$ is much greater than the side thickness W$_B$ and the protruding thickness W$_C$. In one embodiment, a ratio of the bottom thickness W$_A$ and the side thickness W$_B$ is between 2 and 5, preferably 4. In another embodiment, a ratio of the bottom thickness W$_A$ and the protruding thickness W$_C$ is between 2 and 6, preferably 3.

Figure 6:
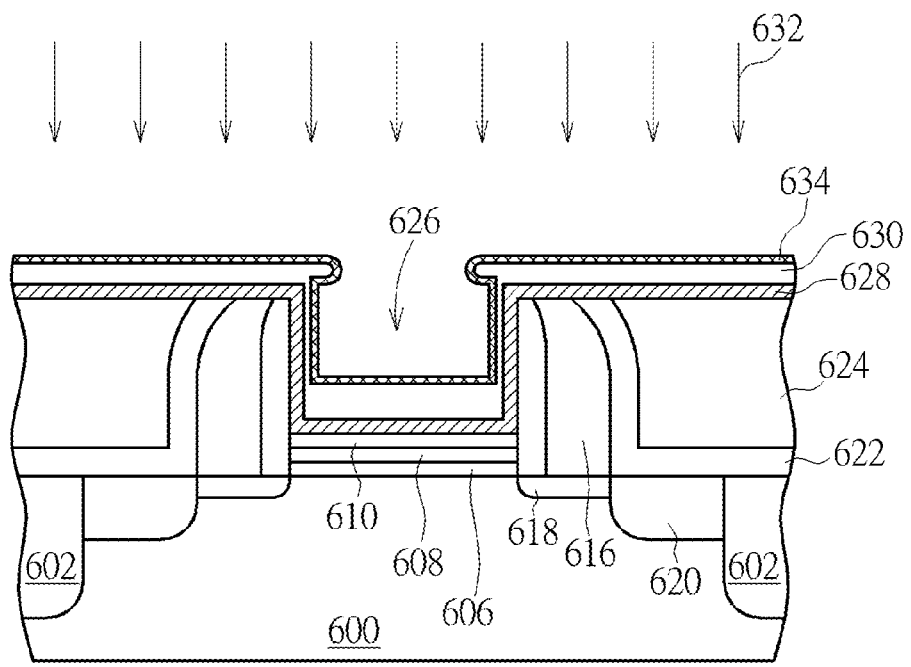

Next, as shown in FIG. 6, an oxidation process 632 is performed such that a top portion of the WFM layer 630 becomes a metal oxide layer 634. In one embodiment, when the WFM layer 630 comprises TiAl, the metal oxide layer 634 comprises TiAlO. In one embodiment, the oxidation process 632 includes supplying a gas containing oxygen such as O$_2$, O$_3$, H$_2$O, N$_2$O, NO$_2$ or their combinations. In one embodiment, the oxidation process 632 can be carried out by exposing the WFM layer 630 to air under a room temperature, or to oxygen gas under a high temperature (200 degrees to 400 degrees for example). Since the WFM layer 630 has a stable crystal phase (TiAl$_3$ for example), only a small portion of the WFM layer 630 is oxidized, thereby forming a thin metal oxide layer 634. Accordingly, the electrical performance of the device can be upgraded. In the embodiment that forms the metal oxide layer 634 in a high temperature (200 degrees to 400 degrees for example), a faster forming rate and a better quality of the metal oxide layer 634 can both be obtained. In addition, since the metal oxide layer 634 is relatively thin, the ratios of the thickness between those portions such as the bottom portion 630A, the side portion 630B and the protruding portion 630C are not changed and remained within a predetermined value.

Figure 7:
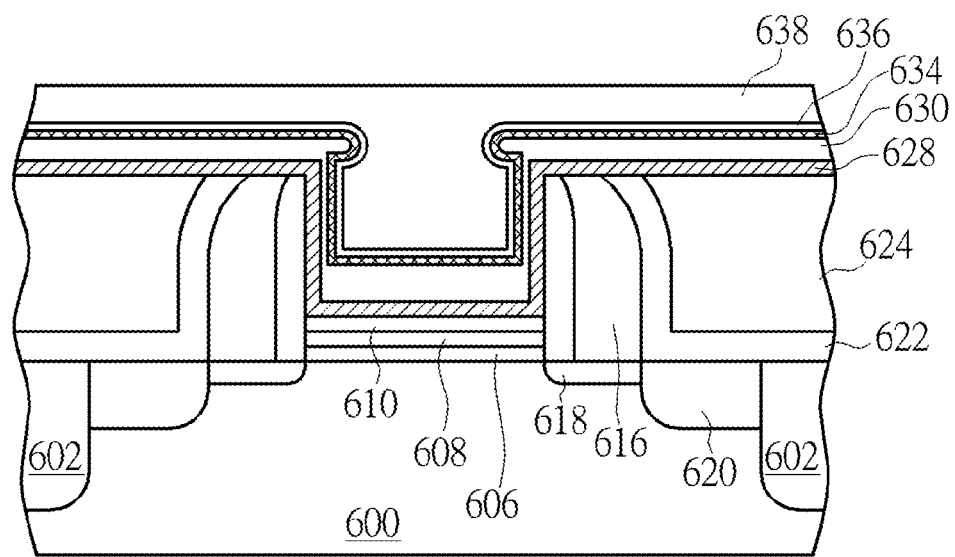

After forming the oxidized WFM layer 634, as shown in FIG. 7, a top barrier layer 636 and a metal layer 638 are formed on the metal oxide layer 634, wherein the trench 626 is completely filled with the metal layer 638. In one embodiment, the top barrier layer 636 is comprised of Ti, TiN, TiAlN, Ta, TaN, TaAlC, TaAlN, TiCuC, TiCuN, TaCuC or TaCuN or their combination, and is not limited thereto. The metal layer 638 can be made of any low resistance material such as Al, Ti, Ta, W, Nb, Mo, TiN, TiC, TaN, Ti/W or Ti/TiN, and is not limited thereto. It is noted that, since the WFM layer 630 has a thicker bottom portion 630A, it can avoid the metal layer 638 protruding downwardly into the high-k dielectric layer 608 or the substrate 600 (so called "spiking phenomenon" in conventional arts). As a result, the top barrier layer 636 can be omitted in some embodiments. In addition, since the WFM layer 630 has a smaller protruding portion 630C, the top barrier layer 636 or the metal layer 638 can be easily filled into the trench 638, avoiding the void problem in conventional arts.

Figure 8:
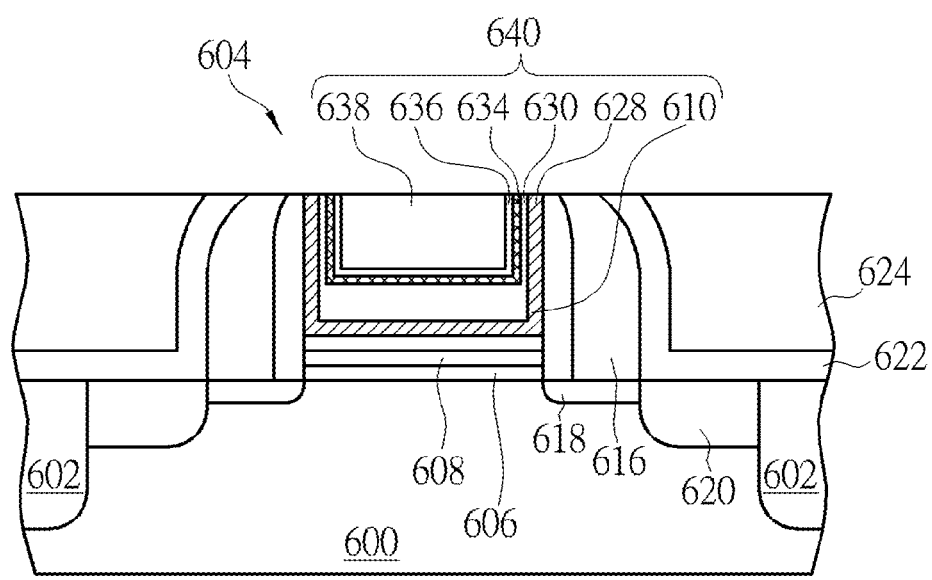

As shown in FIG. 8, a planarization process is performed to remove the metal layer 638, the top barrier layer 636, the metal oxide layer 634, the WFM layer 630 and the bottom barrier layer 628 outside the trench 626. Thus, the etch stop layer 610, the bottom barrier layer 628, the WFM layer 630, the metal oxide layer 634, and the metal layer 638 in the trench 626 together form a metal gate 640 of the transistor 604. The transistor 604 with a metal gate 640 structure is therefore obtained.

It is understood that the above embodiment shows forming the high-k gate dielectric layer at first (namely, the "high-k first" process). However, those skilled in the art can realize that, in the present invention, it is also available to form the high-k gate dielectric layer after removing the sacrifice gate (namely, the "high-k last" process). In another embodiment, the transistor 604 can be non-planar transistors such as FinFET and is not limited to the planar transistor shown above.

The transistor 604 formed by the method in the present invention has good electrical performance and is specifically suitable in a high-frequency integrated circuit. As shown in the following table, under an operation voltage about 1 V, the transistor has a maximum frequency ($f_{max}$) about 275.04 GHz, which is greater than that in conventional arts (239.18 GHz).

| $f_{max}$ (GHz) | The invention | Conventional art |
|---|---|---|
| | 275.04 | 239.18 |

This gained advantage may be resulted from a smaller value of capacitance ($C_{gd}$) and resistance ($R_g$) in the transistor 604. According to the following Equation (I), a smaller $f_{max}$ can therefore be obtained.

$$f_{max} = \frac{f_T}{2\sqrt{R_g(g_{ds} + 2\pi f_T C_{gd})}} \quad \text{Equation (I)}$$

In summary, the metal gate structure and the method set forth in the present invention has a WFM layer with stable phase and a thicker bottom portion, thus solving many problems in convention arts.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A metal gate structure, which is disposed in a trench in a dielectric layer, comprising:
   a work function metal (WFM) layer disposed in the trench, wherein the WFM layer comprises a bottom portion and a side portion, and a ratio of a thickness of the bottom portion and a thickness of the side portion is between 2 and 5, the WFM layer comprises $TiAl_xCu_y$, and x+y=3; and
   a metal layer filled in the trench.

2. The metal gate structure according to claim 1, wherein the WFM layer further comprises a protruding portion disposed at an opening of the trench.

3. The metal gate structure according to claim 2, wherein a ratio of the thickness of the bottom portion and a thickness of the protruding portion is between 2 and 6.

4. The metal gate structure according to claim 1, wherein the WFM layer comprises titanium aluminides (TiAl), aluminum zirconium (ZrAl), aluminum tungsten (WAl), aluminum tantalum (TaAl) or aluminum hafnium (HfAl).

5. The metal gate structure according to claim 1, wherein the WFM layer comprises $TiAl_3$.

6. The metal gate structure according to claim 1, wherein the WFM layer comprises Ni, Pd, Pt, Be, Ir, Te, Re, Ru, Rh, W, Mo, or WN, RuN, MoN, TiN, TaN, or WC, TaC, TiC, or TiAlN, TaAlN.

7. The metal gate structure according to claim 1, further comprising a metal oxide layer disposed between the WFM layer and the metal layer.

8. The metal gate structure according to claim 7, wherein the metal oxide layer comprises TiAlO.

9. The metal gate structure according to claim 1, wherein the metal layer comprises Al or Cu.

\* \* \* \* \*